(12) United States Patent
Kong (10) Patent No.: US 8,680,545 B2
(45) Date of Patent: Mar. 25, 2014

(54) LIGHT EMITTING DEVICE AND METHOD FOR FABRICATING THE SAME

(75) Inventor: Sung Min Kong, Gwangju (KR)

(73) Assignee: LG Innotek Co., Ltd, Seoul (KR)

( * ) Notice: Subject to any disclaimer, the term of this patent is extended or adjusted under 35 U.S.C. 154(b) by 826 days.

(21) Appl. No.: 11/746,783

(22) Filed: May 10, 2007

(65) Prior Publication Data

US 2007/0262332 A1 Nov. 15, 2007

(30) Foreign Application Priority Data

May 11, 2006 (KR) .................. 10-2006-0042199

(51) Int. Cl.
*H01L 33/00* (2010.01)

(52) U.S. Cl.
USPC .................. 257/98; 257/99; 257/E33.058

(58) Field of Classification Search
USPC .............................. 257/81, 99, 100
See application file for complete search history.

(56) References Cited

U.S. PATENT DOCUMENTS

| | | | |
|---|---|---|---|
| 6,274,890 B1 | 8/2001 | Oshio et al. | |
| 6,495,861 B1 | 12/2002 | Ishinaga | |
| 6,547,416 B2 | 4/2003 | Pashley et al. | |
| 7,520,647 B2 * | 4/2009 | Tachibana | 362/516 |
| 7,569,987 B2 | 8/2009 | Naitou | |
| 7,656,083 B2 * | 2/2010 | Sumitani | 313/498 |
| 7,850,344 B2 * | 12/2010 | Shiraishi et al. | 362/298 |
| 8,030,674 B2 * | 10/2011 | Hsu et al. | 257/98 |
| 2002/0030996 A1 * | 3/2002 | Sakakibara | 362/330 |
| 2003/0008431 A1 | 1/2003 | Matsubara et al. | |
| 2004/0046242 A1 * | 3/2004 | Asakawa | 257/678 |
| 2004/0256706 A1 * | 12/2004 | Nakashima | 257/678 |
| 2005/0127816 A1 | 6/2005 | Sumitani | |
| 2005/0133805 A1 | 6/2005 | Yoshimatsu et al. | |
| 2005/0133808 A1 | 6/2005 | Uraya et al. | |
| 2005/0242362 A1 * | 11/2005 | Shimizu et al. | 257/99 |
| 2005/0286264 A1 * | 12/2005 | Kim et al. | 362/600 |
| 2006/0011936 A1 * | 1/2006 | Hiramatsu et al. | 257/100 |
| 2006/0027826 A1 * | 2/2006 | Goodrich | 257/99 |
| 2006/0226435 A1 * | 10/2006 | Mok et al. | 257/98 |
| 2007/0090379 A1 | 4/2007 | Goon et al. | |
| 2007/0120234 A1 | 5/2007 | Kim et al. | |

FOREIGN PATENT DOCUMENTS

| | | |
|---|---|---|
| JP | 1-168079 A | 7/1989 |
| JP | 2000-269551 A | 9/2000 |
| JP | 2001-184924 A | 7/2001 |
| JP | 2002-009349 A | 1/2002 |

(Continued)

OTHER PUBLICATIONS

Office Action dated Apr. 17, 2012 in Japanese Application No. 2007-126415, filed May 11, 2007.

(Continued)

*Primary Examiner* — Benjamin Sandvik
(74) *Attorney, Agent, or Firm* — Birch, Stewart, Kolasch & Birch, LLP (57) ABSTRACT

Embodiments of a light emitting device and a method for fabricating the same are provided. The light emitting device comprises a cavity and one or more light emitting elements. The cavity is formed to a depth of 450 μm or less, and the light emitting elements are installed in the cavity. A fabricating method includes forming a package body having a cavity with a depth of 250 μm to 450 μm and at least one lead frame disposed at the bottom surface of the cavity, mounting at least one light emitting element on the lead frame, and molding a molding member in the cavity.

29 Claims, 7 Drawing Sheets

(56) References Cited

FOREIGN PATENT DOCUMENTS

| | | |
|---|---|---|
| JP | 2002-033520 A | 1/2002 |
| JP | 2002-217459 A | 8/2002 |
| JP | 2003-234008 A | 8/2003 |
| JP | 2003-347600 A | 12/2003 |
| JP | 2004-281856 A | 10/2004 |
| JP | 2004-327503 A | 11/2004 |
| JP | 2004-327504 A | 11/2004 |
| JP | 2005-078937 A | 3/2005 |
| JP | 2005-136349 A | 5/2005 |
| JP | 2005-159090 A | 6/2005 |
| JP | 2005-203748 A | 7/2005 |
| JP | 2005-209763 A | 8/2005 |
| JP | 2005-285874 A | 10/2005 |
| JP | 2005-353699 A | 12/2005 |
| JP | 2006-073656 A | 3/2006 |
| JP | 2006-100575 A | 4/2006 |
| JP | 2006-351773 A | 12/2006 |
| JP | 2007-150315 A | 6/2007 |
| KR | 10-2004-0087566 | 5/2005 |
| KR | 10-2004-0010079 | 8/2005 |
| KR | 10-2005-0081716 A | 8/2005 |

OTHER PUBLICATIONS

Office Action dated May 15, 2012 in Japanese Application No. 2012-001044.

Office Action dated May 1, 2012 in Japanese Application No. 2012-039857.

Office Action dated May 1, 2012 in Japanese Application No. 2012-039856.

Office Action dated Aug. 21, 2012 in Japanese Application No. 2007-126415, filed May 11, 2007.

Office Action dated Aug. 7, 2012 in Japanese Application No. 2012-039856, filed Feb. 27, 2012.

Office Action dated Aug. 21, 2012 in Japanese Application No. 2012-039857, filed Feb. 27, 2012.

Notice of Allowance dated Mar. 5, 2013 in Japanese Application No. 2012-039857, filed Feb. 27, 2012.

English-language Translation for JP-2005-136349-A (May 26, 2005).

English-language Translation for JP-2006-351773-A (Dec. 28, 2006).

English-language Translation for JP-2007-150315-A (Jun. 14, 2007).

* cited by examiner

| No | Type 1 | Type 2 | Type 3 | Type 4 |
|---|---|---|---|---|
| SHAPE | | | | |
| LUMINANCE DISTRIBUTION | | | | |
| TOTAL FLUX | 0.154 | 0.141 | 0.207 | 0.182 |
| INCIDENT FLUX OF LGP | 0.124 | 0.102 | 0.170 | 0.158 |

------- ORIENTATION ANGLE OF MINOR AXIS

———— ORIENTATION ANGLE OF MAJOR AXIS

FIG. 5

| No | Type 11 | Type 12 | Type 13 |
|---|---|---|---|
| SHAPE | | | |
| WIDTH OF BOTTOM SURFACE | 350 | 310 | 380 |
| INSIDE ANGLE | 25 | 28.5 | 20.6 |
| TOTAL FLUX | 0.223 | 0.211 | 0.199 |
| INCIDENT FLUX OF LGP | 0.169 | 0.160 | 0.147 |

| No | Type 14 | Type 15 | Type 16 |
|---|---|---|---|
| SHAPE | | | |
| WIDTH OF BOTTOM SURFACE | 350 | 310 | 380 |
| INSIDE ANGLE | 25 | 28.5 | 20.6 |
| TOTAL FLUX | 0.212 | 0.188 | 0.212 |
| INCIDENT FLUX OF LGP | 0.166 | 0.149 | 0.166 |

LIGHT EMITTING DEVICE AND METHOD FOR FABRICATING THE SAME

CROSS-REFERENCE TO RELATED PATENT APPLICATION

The present invention application claims the benefit under 35 U.S.C. §119 to Korean Patent Application No. 10-2006-0042199, filed May 11, 2006, which is hereby incorporated by reference in its entirety.

BACKGROUND

1. Field of the Invention

Embodiments of the present invention relate to a light emitting device and a method for fabricating the same.

2. Description of the Related Art

Light emitting diodes (LEDs) can implement various colors using a light emitting source. The light emitting source is typically formed of compound semiconductors, e.g., GaAS-based materials, AlGaAs-based materials, GaN-based materials, InGaN-based materials, and InGaAlP-based materials.

An LED package includes an LED chip and is used as a light emitting device.

Light emitted from the LED chip mounted in the LED package is lost by light absorption and light scattering within the LED package. Consequently, the light intensity of the LED package is lower than that of an LED chip, leading to degradation in the luminous efficiency of the light emitting device.

BRIEF SUMMARY

An embodiment provides a light emitting device, which can maximize its luminous efficiency, and a method for fabricating the same.

An embodiment provides a light emitting device, which can minimize a depth of a cavity where the light emitting device is mounted, and a method for fabricating the same.

An embodiment provides a light emitting device, in which sidewalls of a cavity are inclined stepwise, and a method for fabricating the same.

An embodiment provides a light emitting device comprising: a cavity having a depth of 450 μm or less; and a light emitting element in the cavity.

An embodiment provides a light emitting device comprising: a package body including a cavity having a depth of 250 μm to 450 μm and a light emitting element in the cavity; a substrate mounted with the package body; and a light guide panel disposed at one side of the package body.

An embodiment provides a method for fabricating a light emitting device, comprising: forming a package body including a cavity with a depth of 250 μm to 450 μm and a lead frame disposed at the bottom surface of the cavity; mounting a light emitting element on the lead frame; and molding a molding member in the cavity.

It is to be understood that both the foregoing general description and the following detailed description of the embodiments are exemplary and explanatory and are intended to provide further explanation of the invention as claimed.

BRIEF DESCRIPTION OF THE DRAWINGS

FIGS. 11(a)-11(c) are package structure views of an LED package according to the first embodiment.

DETAILED DESCRIPTION

Reference will now be made in detail to the preferred embodiments, examples of which are illustrated in the accompanying drawings. Wherever possible, the same reference numbers will be used throughout the drawings to refer to the same or like parts.

Figure 1:
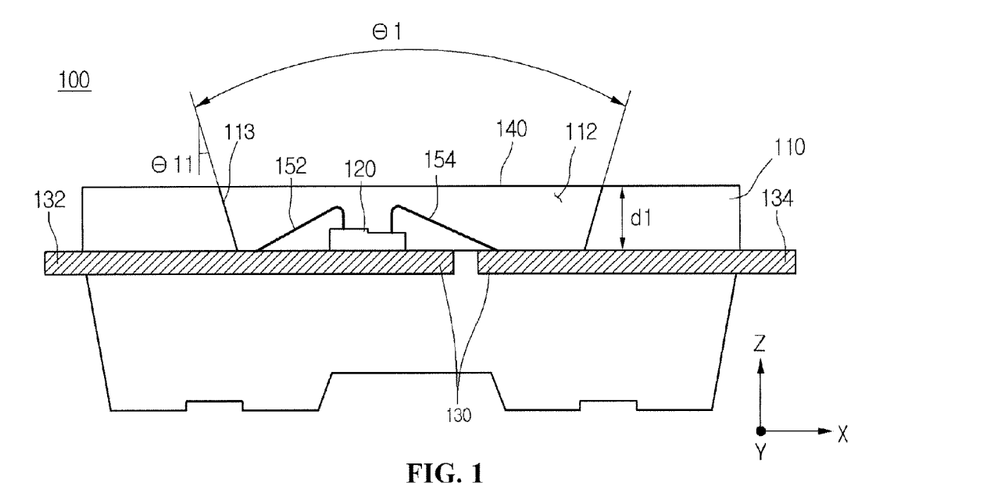
FIG. 1 is a cross-sectional view of a light emitting device according to a first embodiment.
Figure 2:
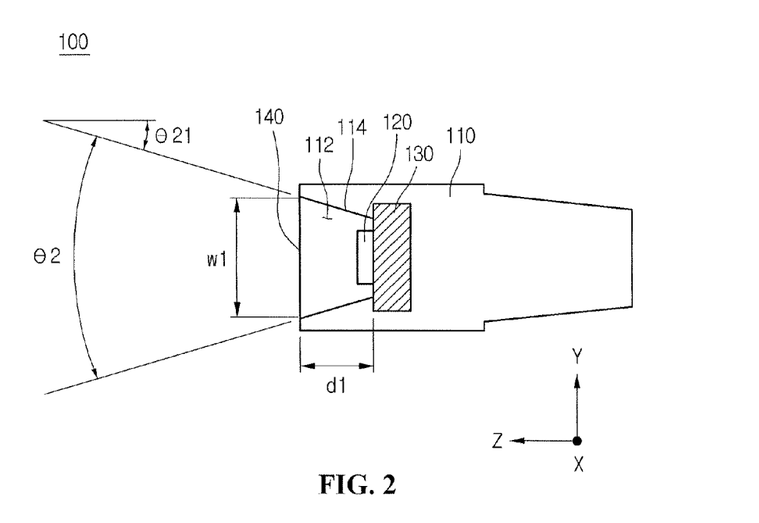
FIG. 2 is a longitudinal cross-sectional view of a light emitting device according to the first embodiment.

FIG. 1 is a cross-sectional view of a light emitting device according to a first embodiment, and FIG. 2 is a longitudinal cross-sectional view of the light emitting device illustrated in FIG. 1.

Referring to FIGS. 1 and 2, a light emitting device 100 can be implemented with a side emission type package or a top emission type package. The light emitting device 100 can be applied to various fields, e.g., a light unit of a display device, an illuminating device, etc. For convenience, the side emission type LED package will be described below for illustrative purposes.

The light emitting device 100 can include a package body 110 with a cavity 112, a light emitting element 120, and a lead frame 130.

The package body 110 may be formed of a resin material. As one example, the package body 110 may be injection molded using a resin material such as PPA in a press molding (Cu/Ni/Ag or Cu/Ag substrate). As another example, the package body 110 may be formed in such a way that a top substrate with a cavity is stacked on a lower substrate with a lead frame 130.

In a case where the light emitting device 100 is implemented with a side emission type LED package, the transverse direction of the package body 110 is a major axis of a length direction X of the package body 110, and the longitudinal direction of the package body 110 is a minor axis of a thickness direction Y of the package body 110.

A cavity 112 can be formed in one side of the package body 110, and a lead frame 130 can be formed under the cavity 112. The lead frame 130 can be inserted in the length direction X of the package body 110.

The lead frame 130 can be provided in plurality and electrically open to each other. Lead electrodes 132 and 134 of each lead frame 130 can be disposed out of the package body 110. At this point, a bottom surface of the cavity 112 may be an upper surface of the lead frame 130.

The cavity 112 of the package body 110 is formed to a predetermined depth or less. A depth "d1" of the cavity 112 is a distance between the top of the cavity 112 and the top of the lead frame 130. The depth "d1" of the cavity 112 may range from approximately 250 μm to approximately 450 μm.

At least one of sidewalls 113 and 114 of the cavity 112 may be inclined. Although all sidewalls of the cavity 112 are illustrated as inclined in FIGS. 1 and 2, this embodiment is not limited to this configuration.

The sidewalls of the cavity 112 can be inclined at a predetermined angle with respect to a Z-axis perpendicular to the bottom surface of the cavity 112. The Z-axis is an axis perpendicular to the bottom surface of the cavity 112 or the top surface of the lead frame 130.

As illustrated in FIG. 1, a first inside angle θ1 formed by the first sidewalls 113 disposed in the length direction of the cavity 112 can be 20-80°, and an angle θ11 of the first sidewalls 113 of the cavity 112 can be inclined outward at 10-40° with respect to the Z-axis. As illustrated in FIG. 2, a second inside angle θ2 formed by the second sidewalls 114 disposed in the thickness direction of the cavity 112 can be 20-40°, and an angle θ21 of the second sidewalls 114 of the cavity 112 can be inclined outward at 10-20° with respect to the Z-axis.

The first and second inside angles θ1 and θ2 may be equal to or different from each other. In addition, the inclined angles θ11 and θ21 of the first and second sidewalls 113 and 114 may be equal to or different from each other.

Due to the inclined sidewalls 113 and 114 of the cavity 112, the upper diameter of the cavity 112 is greater than the lower diameter of the cavity 112. A reflective material (such as, Ag, Al, etc.) may be coated on the sidewalls 113 and 114 of the cavity 112, or a reflective plate may be attached to the sidewalls 113 and 114 of the cavity 112. The cavity 112 may have, but is not limited to, a polygonal outer shape.

At least one semiconductor device may be mounted in the cavity 112. The semiconductor device may include at least one of a light emitting element 120, a light receiving element, and a protection element.

The light emitting element 120 may include at least one LED chip formed of compound semiconductors, for example, GaAS-based materials, AlGaAs-bsaed materials, GaN-based materials, InGaN-based materials, and InGaAlP-based materials. Examples of the LED chip may include a blue LED chip, an ultraviolet LED chip, a red LED chip, a green LED chip, and a yellow-green LED chip. In addition, examples of the LED chip may include a chip having a PN junction structure, a chip having an NPN junction structure, and a chip having two electrodes arranged horizontally or vertically.

The light emitting element 120 can be attached to the top surface of at least one lead frame 130 by a non-conductive adhesive. The light emitting element 120 can be connected to the lead frame 130 using wires 152 and 154 or flip chip technique.

The cavity 112 can be filled with a molding member 140. The molding member 140 can be a transparent resin. A phosphor may be added to the transparent resin. The molding member 140 can be formed of resin materials, for example, a one-liquid-type epoxy, a two-liquid-type epoxy, a hard-type silicone, a soft-type silicone, etc. The molding member 140 can be selected according to use purpose of molding solution or additives, use environments, and characteristics of products.

The surface of the molding member 140 may have a flat shape, a concave lens shape, or a convex lens shape. A convex lens may be further attached to the molding member 140.

In the light emitting device 100, the depth "d1" of the cavity 112 can be formed to be less than 450 μm, while the width of the bottom and top surfaces (the light emitting window region "w1") of the cavity 112 can be maintained equal to that of the related art. Hence, the inclined angle of the sidewalls of the cavity 112 increases.

Therefore, the light emitting device 100 may improve the luminous efficiency more than about 20% compared with the related art. When the light emitting device 100 is used as a light unit, the brightness characteristic can be improved by more than about 30% compared with the related art. The light intensity and luminous flux of the lateral emission type LED package can be increased by increasing the inclined angel of the sidewalls while minimizing the depth of the cavity 112.

Figure 3:
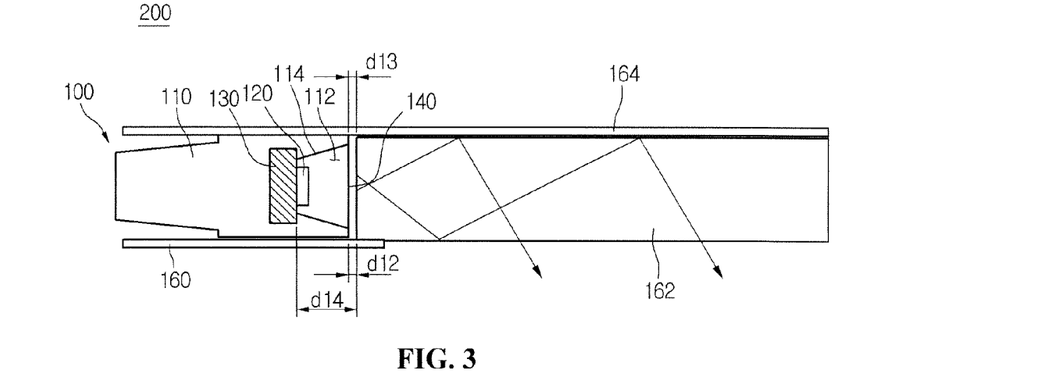
FIG. 3 is a cross-sectional view of a backlight unit having a light emitting device according to the first embodiment.

FIG. 3 is a cross-sectional view of a backlight unit 200 using the light emitting device 100 illustrated in FIG. 2.

Referring to FIG. 3, the light unit 200 can include a light emitting device 100, a substrate 160, a light guide panel (LGP) 162, and a reflector 164.

At least one light emitting device 100 can be mounted on the substrate 160. The LGP 162 can be arranged in a light emitting direction of the light emitting device 100 and guides incident light to form surface light.

The reflector 164 can be disposed under the LGP 162 to reflect leakage light. At least one optical sheet (not shown) may be disposed on the LGP 162. Examples of optical sheets may include a diffusion sheet, a prism sheet, and so on. The substrate 160 may be implemented with a flexible printed circuit board (FPCB), and the reflector 164 may be implemented with a reflection sheet.

Due to an assembly error, a gap of about 200 μm may occur in a distance "d12" between the light emitting device 100 and the LGP 162. If the surface of the molding member 140 has a flat shape, a distance "d13" between the surface of the molding member 140 and the LGP 162 becomes "d12".

If the surface of the molding member 140 has a concave lens shape, a distance between the surface of the molding member 140 and the LGP 162 may become about 300 μm. In this case, a maximum distance between the top surface of the cavity 112 and the surface of the molding member 140 (the height of the concave lens shape) becomes about 100 μm.

When the maximum depth of the cavity 112 is 450 μm, a distance "d14" between the bottom surface of the cavity 112 and the LGP 162 may be about 650 μm (=200 μm+450 μm). Therefore, the distance between the light emitting device 120 and the LGP 162 can be reduced by up to 30% compared with the related art.

In this way, light emitted from the light emitting element 120 of the light emitting device 100 passes through the molding member 140 or is reflected by the sidewalls 114 of the cavity 112 and then is emitted from the package body 110. The light emitted from the package body 110 is incident onto the LGP 162 and is emitted as a surface light from the LGP 162.

At this point, light loss sections can be reduced by minimizing the distance between the light emitting device 120 and the top surface of the cavity 112 and the distance d12 between the top surface of the cavity 112 and the light incident surface of the LGP 162, thereby maximizing the light extraction effect. In addition, it is possible to prevent the reduction of the optical efficiency due to the assembly of the LGP 162 and the light emitting device 100. Furthermore, the guide loss in the LGP 162 can be reduced, improving the brightness intensity.

The luminous flux emitted from the light emitting device 100 may be changed depending on parameters, such as the distance between the light emitting element 120 and the LGP 162, the shape of the surface of the molding member 140, and the inside angle of the cavity 112.

The light emitting device can be used as a backlight source of an LCD in a portable terminal, a surface light source of an illuminating device, and so on. In a surface light source, the light loss section in the light emitting device can be minimized and the light extraction efficiency can be maximized. Moreover, the brightness intensity can be increased.

Figure 4:
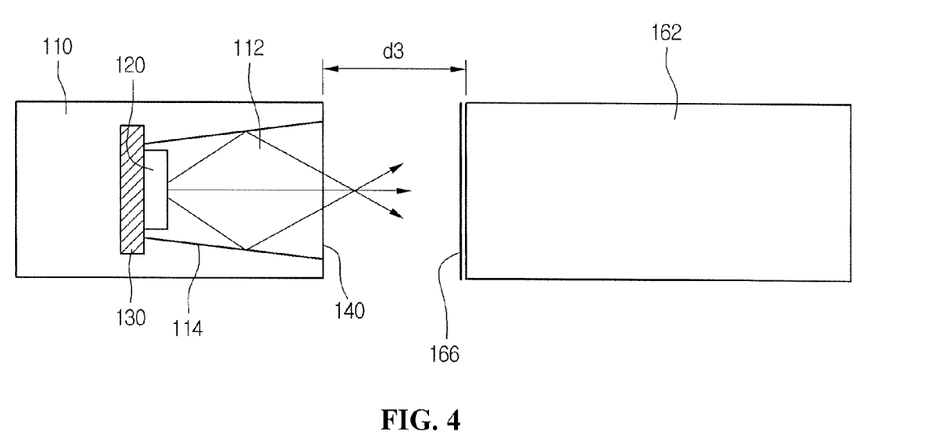
FIG. 4 is a cross-sectional view illustrating an embodiment for a flux measurement of a light emitting device according to the first embodiment.

FIG. 4 is a cross-sectional view illustrating an embodiment for the measurement of light distribution and flux in the light emitting device according to the first embodiment.

Referring to FIG. 4, light emitted from the light emitting element 120 is incident onto a light receiving element 166 and the LGP 162 disposed in front of the light emitting device 100. The light receiving element 166 measures the flux incident onto the LGP 162 and has an area of 5 mm×0.6 mm.

Figure 5:
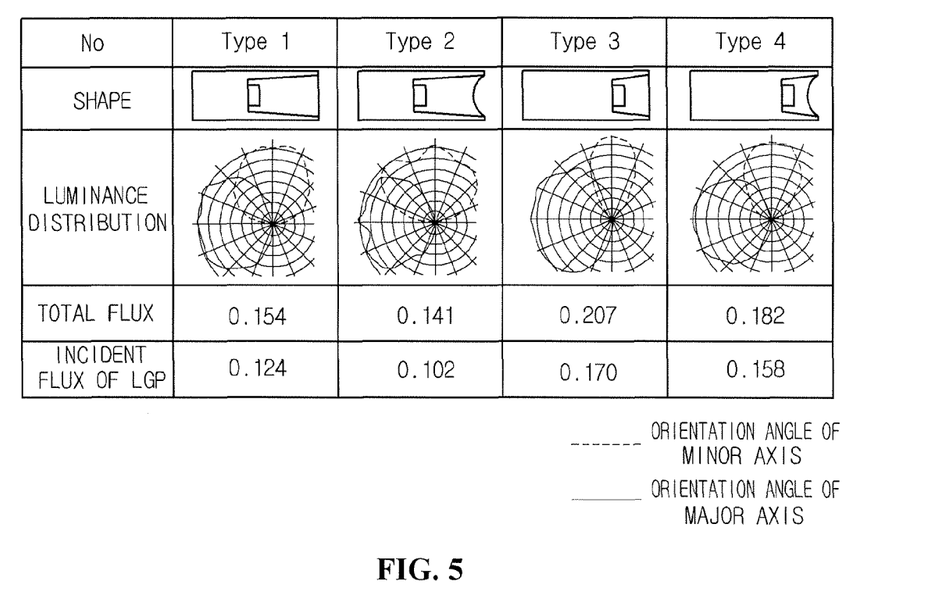
FIG. 5 is a table showing a comparison result of flux with respect to a depth of a cavity and a shape of a molding member in a light emitting device according to the first embodiment.

FIG. 5 is a table showing a comparison result of light distribution and flux received in the light receiving element 166 with respect to a depth of a cavity and a surface shape of a molding member 140 in a light emitting device according to the first embodiment. This simulation used a chip having the package body formed of PPA resin (reflectance =90%), the molding member formed of silicone resin (refractive index =1.42), the light emitting element having a volume of 250 μm×480 μm×80 μm, the peak wavelength of 455 nm, and the full width at half maximum (FWHM) of 22 nm.

Luminance distribution is measured using a luminance distribution (shown as a solid line) of a major-axis direction (or a length direction) and a luminance distribution (shown as a dotted line) of a minor-axis direction (or a thickness direction) of the light emitting device. The total flux is the flux emitted from the light emitting device. The incident flux of the LGP is the flux actually received by the light emitting element (166 in FIG. 4) or the flux incident onto the LGP.

Referring to FIG. 5, in the case of a first package type TYPE 1, the depth of the cavity is 600 μm and the surface of the molding member has a flat shape. In the luminance distribution of the first package type TYPE 1, the total flux is 0.154 lm and the incident flux of the LGP is 0.124 lm.

In the case of a second package type TYPE 2, the depth of the cavity is 600 μm and the surface of the molding member has a concave lens shape. In the luminance distribution of the second package type TYPE 2, the total flux is 0.141 lm and the incident flux of the LGP is 0.102 lm.

In the case of a third package type TYPE 3, the depth of the cavity is 300 μm, and the surface of the molding member has a flat shape. In the luminance distribution of the third package type TYPE 3, the total flux is 0.207 lm and the incident flux of the LGP is 0.170 lm.

In the case of a fourth package type TYPE 4, the depth of the cavity is 300 μm and the surface of the molding member has a concave lens shape. In the luminance distribution of the fourth package type TYPE 4, the total flux is 0.182 lm and the incident flux of the LGP is 0.158 lm.

These package types are formed by changing the depth of the cavity and the surface of the molding member. Compared with the first and second package types TYPE 1 and TYPE 2, the third and fourth package types TYPE 3 and TYPE 4 have wider orientation characteristics of luminance distribution and the increased total flux and incident flux of the LGP.

Figure 6:
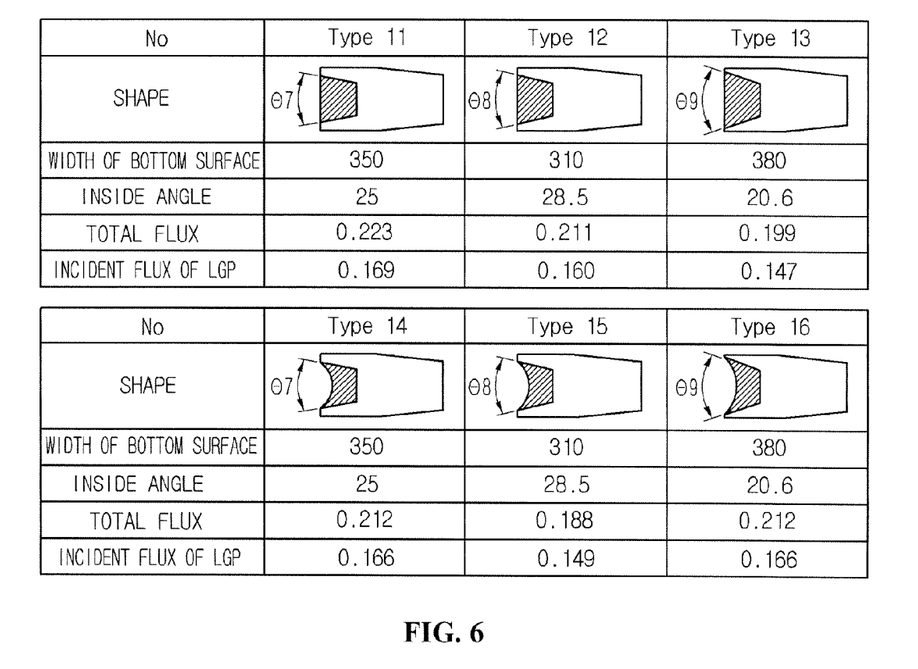
FIG. 6 is a table showing a comparison result of flux with respect to an area of a bottom surface of a cavity, an inside angle, and a shape of a molding member in a light emitting device according to the first embodiment.

FIG. 6 is a table showing a comparison result of total flux and incident flux of the LGP with respect to second inside angles θ7, θ8 and θ9 of a cavity, an area of a bottom surface of the cavity, an inside angle, and a surface shape of a molding member in the light emitting device according to the first embodiment. The experimental conditions of FIG. 6 are identical to those of FIG. 5.

In the case of eleventh to thirteenth package types TYPE 11, TYPE 12 and TYPE 13, the surface of the molding member has a flat shape and the inside angles θ7, θ8 and θ9 of the cavity and the area of the bottom surface vary. In the case of fourteenth to sixteenth package types TYPE 14, TYPE 15 and TYPE 16, the surface of the molding member has a concave lens shape and the inside angles θ7, θ8 and θ9 of the cavity and the area of the bottom surface vary. The cavities of the eleventh to sixteenth package types TYPE 11 to TYPE 16 have the same depth in the range from 250 μm to 450 μm.

In the case of the eleventh and fourteenth package types TYPE 11 and TYPE 14, the inside angle θ7 is 25° and the area of the bottom surface of the cavity is 350 μm. In the case of the twelfth and fifteenth package types TYPE 12 and TYPE 15, the inside angle θ8 is 28.5° and the area of the bottom surface of the cavity is 310 μm. In the case of the thirteenth and sixteenth package types TYPE 13 and TYPE 16, the inside angle θ9 is 20.6° and the area of the bottom surface of the cavity is 380 μm. That is, the inside angle of the cavity is inversely proportional to the area of the bottom surface of the cavity.

The measured total flux in the eleventh to sixteenth package types TYPE 11 to TYPE 16 are respectively 0.233 lm, 0.211 lm, 0.199 lm, 0.212 lm, 0.188 lm, and 0.212 lm.

The measured incident flux of the LGP in the eleventh to sixteenth package types TYPE 11 to TYPE 16 are respectively 0.169 lm, 0.160 lm, 0.147 lm, 0.166 lm, 0.149 lm, and 0.166 lm.

The eleventh to sixteenth package types TYPE 11 to TYPE 16 have larger flux than the first and second package types TYPE 1 and TYPE 2. In addition, the eleventh package type TYPE 11 is larger than the other package types in terms of the total flux and the incident flux of the LGP. That is, when the cavities have the same depth, the total flux and the incident flux of the LGP vary depending on the inside angle of the cavity and the area of the bottom surface.

In the above-described light emitting devices, the intensity and flux of a lateral emission type LED can be increased by increasing the tilt angle of the sidewalls while minimizing the depth of the cavity.

Figure 7:
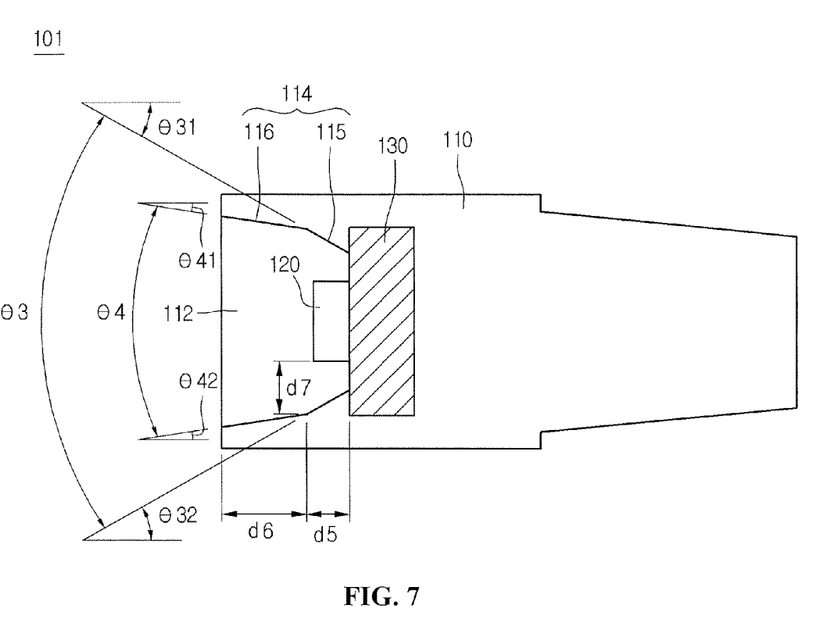
FIG. 7 is a longitudinal cross-sectional view of a light emitting device according to a second embodiment.

FIG. 7 is a longitudinal cross-sectional view of a light emitting device 101 according to a second embodiment.

Referring to FIG. 7, a package body 110 can be constructed in such a way that each sidewall 114 of the cavity 112 has two or more inclined surfaces. The sidewall 114 of the cavity 112 can include a lower sidewall 115 and an upper sidewall 116, where a third inside angle θ3 of the lower sidewall 115 is larger than a fourth inside angle θ4 of the upper sidewall 116. The total depth "d5+d6" of the cavity 112 is equal to or less than 450 μm, and the depth d6 of the upper sidewall 116 is larger than the depth d5 of the lower sidewall 115.

For example, the lower sidewall 115 of the cavity 112 can extend to a location of 70 μm to 250 μm from the bottom surface of the cavity 112, and the third inside angle θ3 can be 30° to 50°. The upper sidewall 116 can extend to the top of the cavity 112 by a depth d6 of 200 μm to 380 μm, and the fourth inside angle θ4 of the upper sidewall 116 can be about 0 to 20°. The angles θ31 and θ32 of both of the lower sidewalls 115 may be identical to or different from each other within the range of the third inside angle θ3 of the lower sidewall 115. Likewise, the angles θ41 and θ42 of both of the upper sidewalls 116 may be identical to or different from each other within the range of the fourth inside angle θ4 of the upper sidewall 116.

The lower sidewall 115 of the cavity 112 may be formed to the height at which the light emitted from a light emitting element 120 can be maximally reflected upward. For example, the height can be greater than the height (e.g., 70 μm to 130 μm) of the light emitting element 120. At this point, due to the angle θ3 of the lower sidewall 115, the distance d7 between the light emitting element 120 and the lower sidewall 115 becomes larger, thereby preventing the color of molding resin (i.e., the sidewall) from changing due to light or heat emitted from the light emitting element 120.

In addition, when compared with other cavities, the optical efficiency of the cavity 112 can be maximized by adjusting the tilt angle of the cavity 112 to the sidewall 114.

Figure 8:
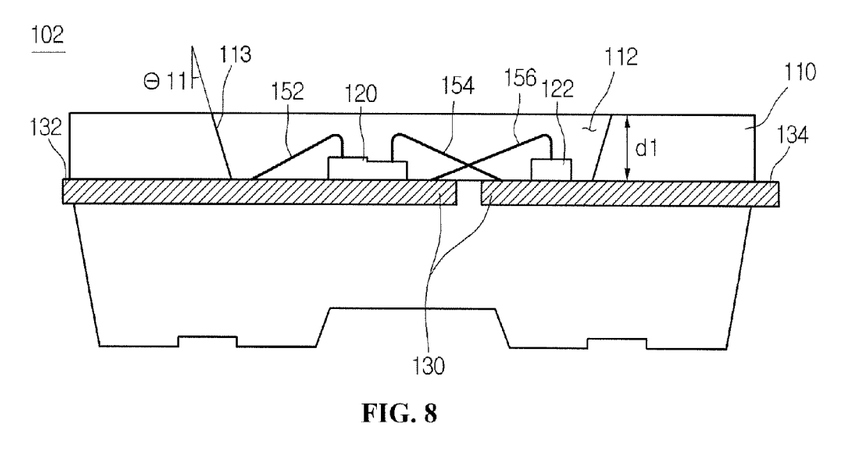
FIGS. 8 to 10 are cross-sectional views illustrating other examples of a light emitting device according to the first embodiment.
Figure 9:
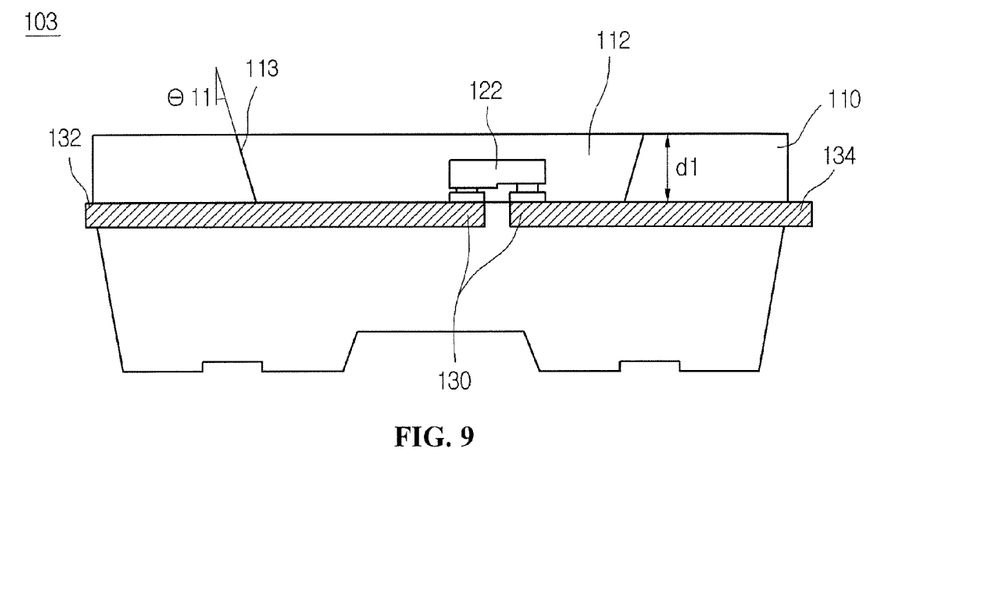
Figure 10:
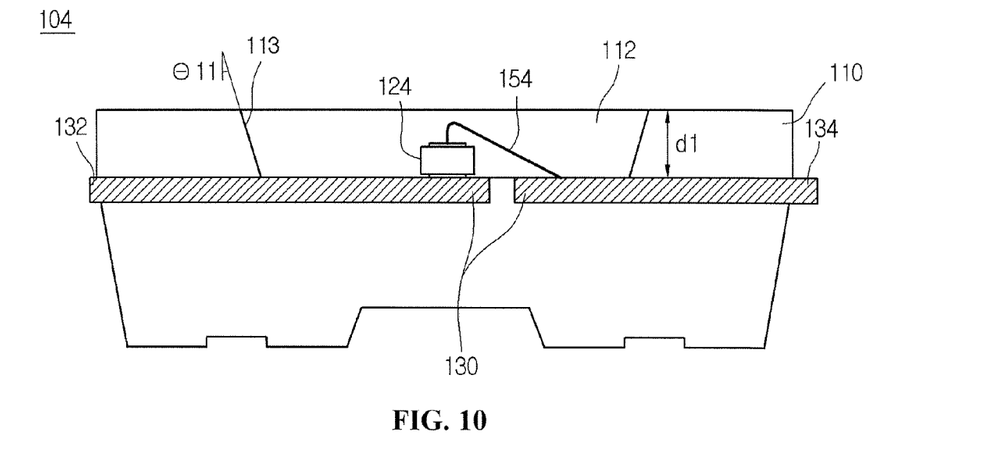

FIGS. 8 to 10 are cross-sectional views illustrating other examples of a light emitting device according to the first embodiment.

Referring to FIG. 8, a light emitting device 102 can be mounted with one or more light emitting elements 120 and one or more protection elements 122. The light emitting element 120 and the protection element 122 can be mounted on lead frames 130 in a cavity 112 of a package body 110 in a chip type. The light emitting element 120 can be attached to one lead frame 130 and connected by wires 152 and 154. The protection element 122 can be attached to another lead frame 130 and connected to the lead frame 130 where the light emitting element 120 is attached by a wire 156. Alternatively, semiconductor devices may be mounted in a flip-chip type in order to reduce the height of the wire in the cavity.

Referring to FIG. 9, a light emitting device 103 can be mounted with one or more light emitting elements 124 in a flip-chip type. To this end, both electrodes of the light emitting element 124 can be connected to two lead frames 130 using solder bumps.

Referring to FIG. 10, a light emitting device 104 can include one or more vertical-type light emitting elements 124. To this end, a first electrode of the vertical-type light emitting element 124 can be attached to one lead frame 130 by conductive adhesive, and a second electrode of the vertical-type light emitting element 124 can be connected to another lead frame 130 by a wire 154.

In addition, lead electrodes 132 and 134 of the two lead frames 130 can be formed outside the package body 110 of FIGS. 8 to 10.

Figure 11A:
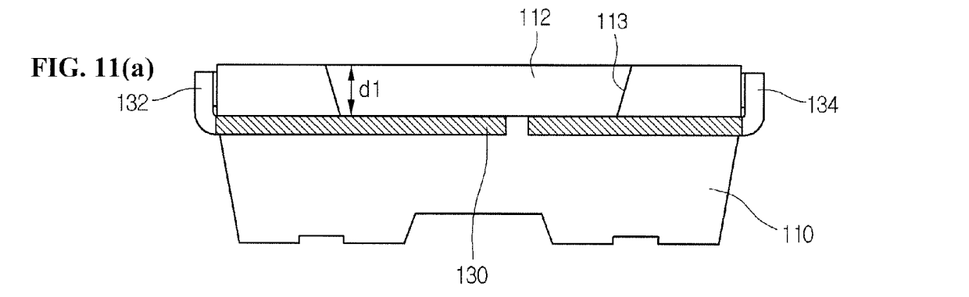
FIG. 11(a) is a cross-sectional view of a package body.
Figure 11B:
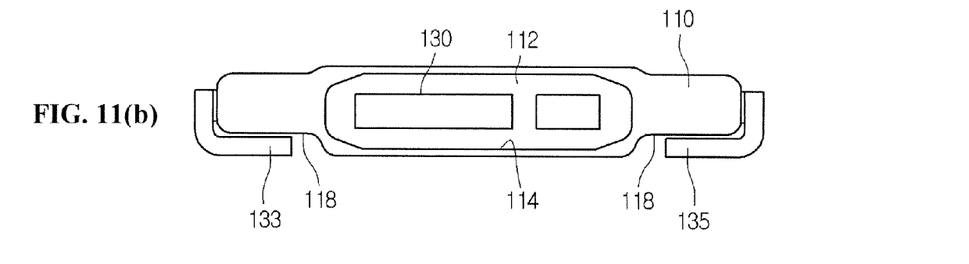
FIG. 11(b) is a front view of the package body.
Figure 11C:
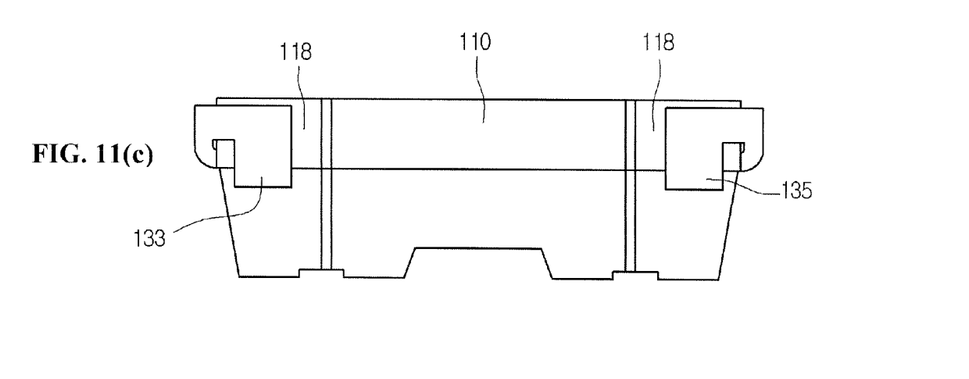
FIG. 11(c) is a bottom view of the package body.

FIG. 11 illustrates a package structure of a light emitting device according to the first embodiment before a semiconductor device is mounted thereon. Specifically, FIG. 11(a) is a cross-sectional view of a package body, FIG. 11(b) is a top/front view of the package body, and FIG. 11(c) is a bottom view of the package body.

Referring to FIG. 11(a), a lead frame 130 located at the bottom of the cavity 112 of the package body 110 forms a base line for the height d1 and corresponds to the bottom surface of the cavity 112.

Referring to FIGS. 11(b) and 11(c), the first and second lead electrodes 132 and 134 of the lead frame 130 can be primarily formed at the outside of the package body 110 in a lateral direction, and can be formed in a groove 118 at both bottom sides of the package body 110. The both ends 133 and 135 of the first and second lead electrodes 132 and 134 can be disposed at the both bottom sides of the package body 110 and thus can be installed on a substrate by surface mount technology (SMT).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a package body comprising a cavity, the cavity having a bottom surface and four inclined sidewalls, the cavity having a depth of 450 μm or less in the package body; and
a light emitting element in the cavity,
wherein the four inclined sidewalls include a first inclined sidewall slanted with reference to the bottom surface, a second inclined sidewall slanted with reference to the bottom surface and facing the first inclined sidewall, a third inclined sidewall slanted with reference to the bottom surface, and a fourth inclined sidewall slanted with reference to the bottom surface and facing the third inclined sidewall,
wherein, along the bottom surface of the cavity, a distance between the first inclined sidewall and the second inclined sidewall is different from a distance between the third inclined sidewall and the fourth inclined sidewall, and
wherein an angle between the first inclined sidewall and a first imaginary plane perpendicular to the bottom surface of the cavity, an angle between the second inclined sidewall and the first imaginary plane perpendicular to the bottom surface of the cavity, an angle between the third inclined sidewall and a second imaginary plane perpendicular to the bottom surface of the cavity, and an angle between the fourth inclined sidewall and the second imaginary plane perpendicular to the bottom surface of the cavity are all different from each other.

2. The light emitting device according to claim 1, wherein respective inclined angles of the third inclined sidewall and the fourth inclined sidewall with reference to the second imaginary plane perpendicular to the bottom surface of the cavity are in a range from about 10° to about 20°.

3. The light emitting device according to claim 1, wherein respective inclined angles of the first inclined sidewall and the second inclined sidewall with reference to the first imaginary plane perpendicular to the bottom surface of the cavity are in a range from about 10° to about 40°.

4. The light emitting device according to claim 1, further comprising a molding member disposed on the light emitting element.

5. The light emitting device according to claim 4, wherein the molding member has at least one of a flat shape, a concave lens shape, or a convex lens shape.

6. The light emitting device according to claim 4, wherein the molding member comprises a phosphor.

7. The light emitting device according to claim 4, wherein the molding member is formed of at least one of an epoxy or a silicone.

8. The light emitting device according to claim 1, wherein the light emitting element includes at least one light emitting diode formed of GaAs-based materials, AlGaAs-based materials, GaN-based materials, InGaN-based materials, or InGaAlP-based materials.

9. The light emitting device according to claim 1, further comprising a lead frame connected to the light emitting element and disposed at the bottom surface of the cavity, wherein an angle between the third inclined sidewall and an imaginary plane perpendicular to an upper surface of the lead frame disposed at the bottom surface of the cavity is different from an angle between the fourth inclined sidewall and the imaginary plane perpendicular to the upper surface of the lead frame disposed at the bottom surface of the cavity.

10. The light emitting device according to claim 2, wherein the cavity has a depth of about 250 µm to about 450 µm.

11. The light emitting device according to claim 1, wherein an angle between the first inclined sidewall and the second inclined sidewall is different from an angle between the third inclined sidewall and the fourth inclined sidewall.

12. The light emitting device according to claim 1, wherein the light emitting device includes a side emission type package body.

13. The light emitting device according to claim 1, wherein an angle between the first inclined sidewall and the second inclined sidewall is in a range from about 20° to about 80°.

14. The light emitting device according to claim 1, wherein an angle between the third inclined sidewall and the fourth inclined sidewall is in a range from about 20° to about 40°.

15. The light emitting device according to claim 1, wherein the bottom surface of the cavity is substantially flat.

16. The light emitting device according to claim 1, wherein a width of the third inclined sidewall is substantially the same as a width of the fourth inclined sidewall.

17. The light emitting device according to claim 1, wherein each of the four inclined sidewalls is extended from and contacts a respectively corresponding side of the bottom surface of the cavity.

18. The light emitting device according to claim 1, wherein at least one of the four inclined sidewalls includes a first inclined surface and a second inclined surface,
wherein the first inclined surface is slanted with reference to the bottom surface of the cavity and extends from the bottom surface of the cavity, and
wherein the second inclined surface is slanted with reference to the bottom surface of the cavity and is connected to an upper end portion of the first inclined surface.

19. The light emitting device according to claim 18, wherein an angle between the first inclined surface and an imaginary plane perpendicular to the bottom surface of the cavity is greater than an angle between the second inclined surface and the imaginary plane perpendicular to the bottom surface of the cavity.

20. The light emitting device according to claim 18, wherein an angle between the first inclined surface and an imaginary plane perpendicular to the bottom surface of the cavity is 15° to 25°.

21. The light emitting device according to claim 18, wherein an angle between the second inclined surface and an imaginary plane perpendicular to the bottom surface of the cavity is 0° to 10°.

22. The light emitting device according to claim 18, wherein a depth from an upper end portion of the second inclined surface to the upper end portion of the first inclined surface is greater than a depth from the upper end portion of the first inclined surface to a bottom portion of the first inclined surface.

23. The light emitting device according to claim 1, wherein a periphery shape of the cavity along upper portions of the four inclined sidewalls is substantially a polygonal shape.

24. The light emitting device according to claim 14, wherein the third inclined sidewall and the fourth inclined sidewall are disposed along a length direction of the package body.

25. A light unit comprising:
a light emitting device including:
a package body comprising a cavity, the cavity having a bottom surface and four inclined sidewalls, the cavity having a depth of 450 µm or less in the package body; and
a light emitting element in the cavity,
wherein the four inclined sidewalls include a first inclined sidewall slanted with reference to the bottom surface, a second inclined sidewall slanted with reference to the bottom surface and facing the first inclined sidewall, a third inclined sidewall slanted with reference to the bottom surface, and a fourth inclined sidewall slanted with reference to the bottom surface and facing the third inclined sidewall,
wherein, along the bottom surface of the cavity, a distance between the first inclined sidewall and the second inclined sidewall is different from a distance between the third inclined sidewall and the fourth inclined sidewall, and
wherein an angle between the first inclined sidewall and a first imaginary plane perpendicular to the bottom surface of the cavity, an angle between the second inclined sidewall and the first imaginary plane perpendicular to the bottom surface of the cavity, an angle between the third inclined sidewall and a second imaginary plane perpendicular to the bottom surface of the cavity, and an angle between the fourth inclined sidewall and the second imaginary plane perpendicular to the bottom surface of the cavity are all different from each other.

26. The light unit according to claim 25, wherein respective inclined angles of the third inclined sidewall and the fourth inclined sidewall with reference to the second imaginary plane perpendicular to the bottom surface of the cavity are in a range from about 10° to about 20°.

27. The light unit according to claim 25, wherein respective inclined angles of the first inclined sidewall and the second inclined sidewall with reference to the first imaginary plane perpendicular to the bottom surface of the cavity are in a range from about 10° to about 40°.

28. The light unit according to claim 25, further comprising a lead frame connected to the light emitting element and disposed at the bottom surface of the cavity, wherein the cavity has a depth of about 250 µm to about 450 µm, and wherein an angle between the third inclined sidewall and an imaginary plane perpendicular to an upper surface of the lead frame disposed at the bottom surface of the cavity is different from an angle between the fourth inclined sidewall and the imaginary plane perpendicular to the upper surface of the lead frame disposed at the bottom surface of the cavity.

29. The light unit according to claim 25, wherein a periphery shape of the cavity along upper portions of the four inclined sidewalls is substantially a polygonal shape.

* * * * *